US012738311B2

(12) United States Patent
You

(10) Patent No.: US 12,738,311 B2
(45) Date of Patent: Sep. 15, 2026

(54) MEMORY DEVICE FOR SELF-SEARCHING FOR BOUNDARY WORD LINE, METHOD FOR OPERATING MEMORY DEVICE, AND MEMORY SYSTEM INCLUDING MEMORY DEVICE

(71) Applicant: SK hynix Inc., Gyeonggi-do (KR)

(72) Inventor: Byoung Sung You, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 347 days.

(21) Appl. No.: 18/455,625

(22) Filed: Aug. 25, 2023

(65) Prior Publication Data

US 2024/0355377 A1 Oct. 24, 2024

(30) Foreign Application Priority Data

Apr. 24, 2023 (KR) ........................ 10-2023-0053086

(51) Int. Cl.
*G11C 11/4078* (2006.01)
*G11C 11/408* (2006.01)
*G11C 11/4093* (2006.01)
*G11C 11/4096* (2006.01)

(52) U.S. Cl.
CPC ...... *G11C 11/4078* (2013.01); *G11C 11/4085* (2013.01); *G11C 11/4093* (2013.01); *G11C 11/4096* (2013.01)

(58) Field of Classification Search
CPC ............ G11C 11/4078; G11C 11/4085; G11C 11/4093; G11C 11/4096
See application file for complete search history.

(56) References Cited

U.S. PATENT DOCUMENTS 9,899,077 B2 2/2018 Hsu et al.
2017/0293437 A1* 10/2017 Lo .......................... G11C 16/16
2020/0133574 A1* 4/2020 Lee ..................... G06F 12/0246
2021/0272634 A1 9/2021 Shirota et al.

* cited by examiner

*Primary Examiner* — Alfredo Bermudez Lozada
(74) *Attorney, Agent, or Firm* — IP&T GROUP LLP

(57) ABSTRACT

A memory device comprising a plurality of word lines and a plurality of bit lines, and a control circuit configured to select a search group through a group-based binary search method for a plurality of groups obtained by grouping the plurality of word lines by a set number, perform a checking operation of simultaneously checking whether a boundary word line exists among word lines of the search group and at which location among the word lines of the search group the boundary word line is located, on the basis of a search current flowing through the plurality of bit lines, in a state in which a detection voltage is applied to all word lines of the search group each time the search group is selected, generate location information when a location of the boundary word line is checked in the checking operation, and output the location information to the outside.

22 Claims, 12 Drawing Sheets

FIG. 1

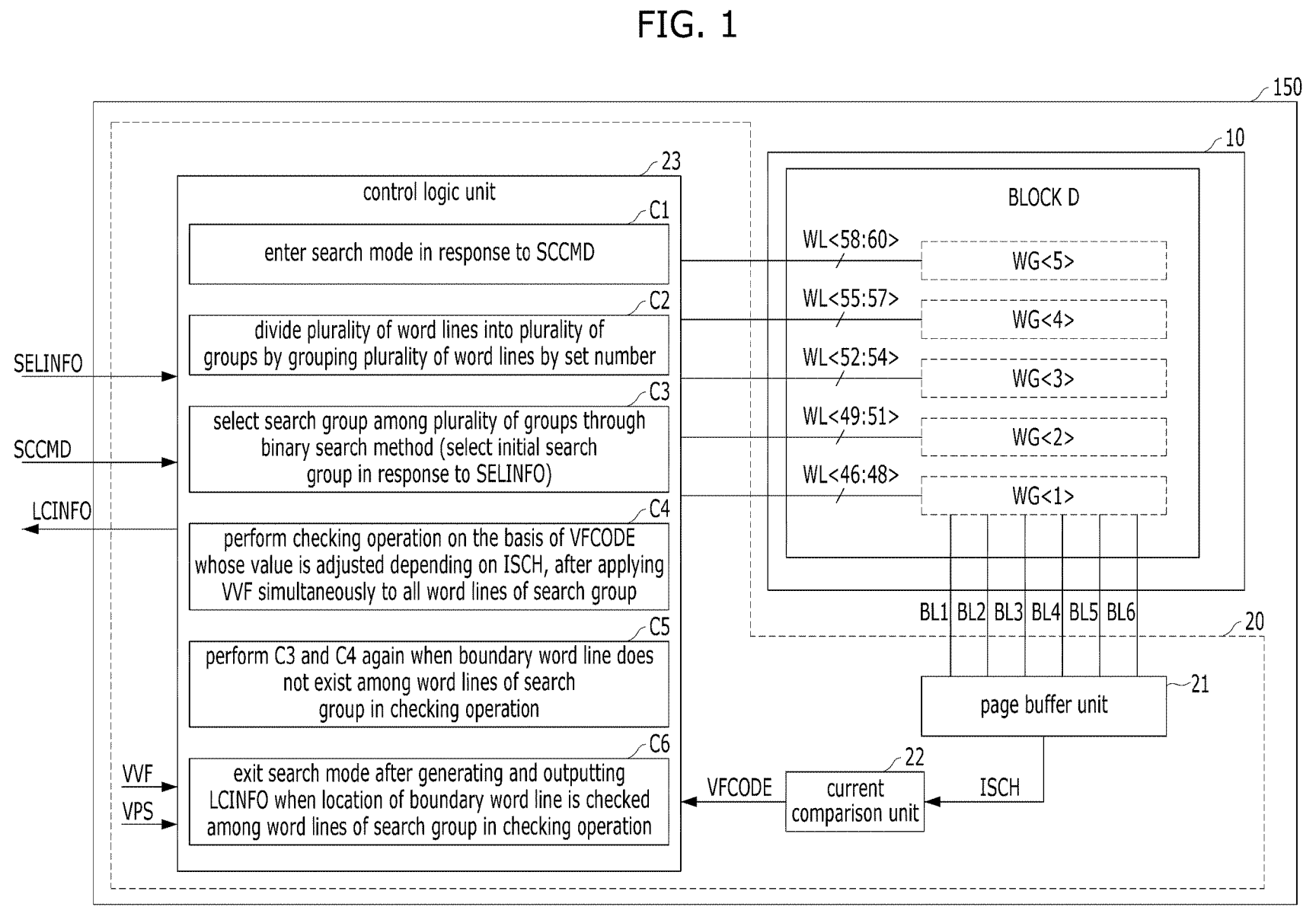

150
10
BLOCK D
WG<5>
WG<4>
WG<3>
WG<2>
WG<1>
WL<58:60>
WL<55:57>
WL<52:54>
WL<49:51>
WL<46:48>
BL1 BL2 BL3 BL4 BL5 BL6
20
21
page buffer unit
ISCH
22
current comparison unit
VFCODE
23
control logic unit
C1 enter search mode in response to SCCMD
C2 divide plurality of word lines into plurality of groups by grouping plurality of word lines by set number
C3 select search group among plurality of groups through binary search method (select initial search group in response to SELINFO)
C4 perform checking operation on the basis of VFCODE whose value is adjusted depending on ISCH, after applying VVF simultaneously to all word lines of search group
C5 perform C3 and C4 again when boundary word line does not exist among word lines of search group in checking operation
C6 exit search mode after generating and outputting LCINFO when location of boundary word line is checked among word lines of search group in checking operation
SELINFO
SCCMD
LCINFO
VVF
VPS

| determination result of operation performer (233) | boundary word line does not exist | location table | | | boundary word line does not exist |
|---|---|---|---|---|---|
| | | FIRST WL | SECOND WL | THIRD WL | |
| VFCODE | 000 | 001 | 010 | 011 | 100 |
| percentage of cells in program state in search group | 0% | 25% | 50% | 75% | 100% |

MEMORY DEVICE FOR SELF-SEARCHING FOR BOUNDARY WORD LINE, METHOD FOR OPERATING MEMORY DEVICE, AND MEMORY SYSTEM INCLUDING MEMORY DEVICE

CROSS-REFERENCE TO RELATED APPLICATION

This application claims priority under 35 U.S.C. § 119 to Korean Patent Application No. 10-2023-0053086 filed on Apr. 24, 2023, which is incorporated herein by reference in its entirety.

BACKGROUND

1. Field

Embodiments of the present disclosure relate to a semiconductor device, and more particularly, to a memory device which self-searches for a boundary word line in a recovery operation after a sudden power-off (SPO), a method for operating the memory device and a memory system including the memory device.

2. Discussion of the Related Art

Memory systems are storage devices embodied using a semiconductor such as silicon (Si), germanium (Ge), gallium arsenide (GaAs), indium phosphide (InP), or the like. The memory systems are classified into a volatile memory device and a nonvolatile memory device. The volatile memory device is a memory device in which data stored therein is lost when power supply is interrupted. Representative examples of the volatile memory device include static random access memory (SRAM), dynamic RAM (DRAM), synchronous DRAM (SDRAM), etc. The nonvolatile memory device is a memory device in which data stored therein is retained even when the power supply is interrupted. Representative examples of the nonvolatile memory device include a read only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc. Flash memories are chiefly classified into a NOR-type memory and NAND-type memory.

In a memory system, a sudden power-off (SPO) in which a power supply is suddenly cut off while a program operation on a nonvolatile memory device included in the memory system is performed may occur. When an SPO occurs in this way, the memory system may perform a recovery operation for the nonvolatile memory device after the power supply is started again after the SPO.

In the recovery operation for the nonvolatile memory device performed in the memory system, an operation of searching for a location where the SPO occurred, that is, a boundary word line of a memory block where a program operation was being performed among a plurality of memory blocks included in the nonvolatile memory device, may be included. The boundary word line may mean a word line in an erased state, which is successively adjacent to a word line in a program state or may mean a word line in a program state, which is successively adjacent to a word line in an erase state.

A conventional method is used in which a controller included in the memory system reads a plurality of word lines included in the nonvolatile memory device one by one by the controller according to a binary search or linear search method and then searches for a boundary word line by checking the state of each word line through read data. Accordingly, the controller and the nonvolatile memory device included in the conventional memory system may search for a boundary word line after repeatedly performing an operation of transmitting a read command and read data between them.

SUMMARY

Various embodiments of the present disclosure are directed to a memory device which self-searches for a boundary word line in a recovery operation after a sudden power-off (SPO), a method for operating the memory device and a memory system including the memory device.

It is to be understood that technical objects to be achieved by the present disclosure are not limited to the aforementioned technical objects and other technical objects which are not mentioned herein and will be apparent from the following description to one of ordinary skill in the art to which the present disclosure pertains.

An aspect of an embodiment of the present disclosure includes a memory device which may include: a memory cell array including a plurality of memory cells which are coupled between a plurality of word lines and a plurality of bit lines; and a control circuit configured to: select a search group through a group-based binary search method for a plurality of groups obtained by grouping the plurality of word lines by a set number in an entry period of a search mode, perform a checking operation of simultaneously checking whether a boundary word line exists among word lines of the search group and at which location among the word lines of the search group the boundary word line is located, on the basis of a search current flowing through the plurality of bit lines, in a state in which a detection voltage is applied to all word lines of the search group each time the search group is selected, generate location information when a location of the boundary word line is checked in the checking operation, and exit the search mode after outputting the location information to the outside.

An aspect of an embodiment of the present disclosure includes a memory system may include: a controller configured to generate and output a search command when power is resumed after a sudden power-off (SPO), and perform a recovery operation in response to location information; and a first memory device including a plurality of memory cells which are coupled between a plurality of word lines and a plurality of bit lines, and a control circuit configured to: select a search group through a group-based binary search method for a plurality of groups obtained by grouping the plurality of word lines by a set number, in a state in which a search mode is entered in response to the search command, perform a checking operation of checking whether a boundary word line exists among word lines of the search group and at which location among the word lines of the search group the boundary word line is located, on the basis of a search current flowing through the plurality of bit lines, in a state in which a detection voltage is applied to all word lines of the search group each time the search group is selected, generate location information when a location of the boundary word line is checked in the checking operation, and output the location information to the controller.

An aspect of an embodiment of the present disclosure includes A method for operating a memory device including a plurality of memory cells coupled between a plurality of word lines and a plurality of bit lines, the method may include: entering a search mode in response to a search command; selecting a search group through a group-based binary search method for a plurality of groups obtained by grouping the plurality of word lines by a set number in an entry period of the search mode; performing a checking operation of checking whether a boundary word line exists among word lines of the search group selected in the selecting and at which location among the word lines of the search group the boundary word line is located, on the basis of a search current flowing through the plurality of bit lines, in a state in which a detection voltage is applied to all word lines of the search group; and repeating the selecting and the checking when the boundary word line does not exist among the word lines of the search group in the checking operation, generating location information when a location of the boundary word line is checked, and exiting the search mode after outputting the location information to the outside.

According to the embodiments of the present disclosure, by including, in a memory device, a circuit for searching for a boundary word line in a recovery operation after an SPO, the memory device may self-search for a boundary word line and output location information of the boundary word line to the outside.

Through this, the time required to search for a boundary word line in a recovery operation may be minimized.

BRIEF DESCRIPTION OF THE DRAWINGS

FIG. 1 is a diagram for describing an example of a memory device which self-searches for a boundary word line, in accordance with a first embodiment of the present disclosure.

FIG. 6 is a diagram for describing a detailed configuration of a location table included in the control logic unit among the components of the memory device in accordance with the first embodiment of the present disclosure illustrated in FIG. 1.

DETAILED DESCRIPTION

Figure 2:
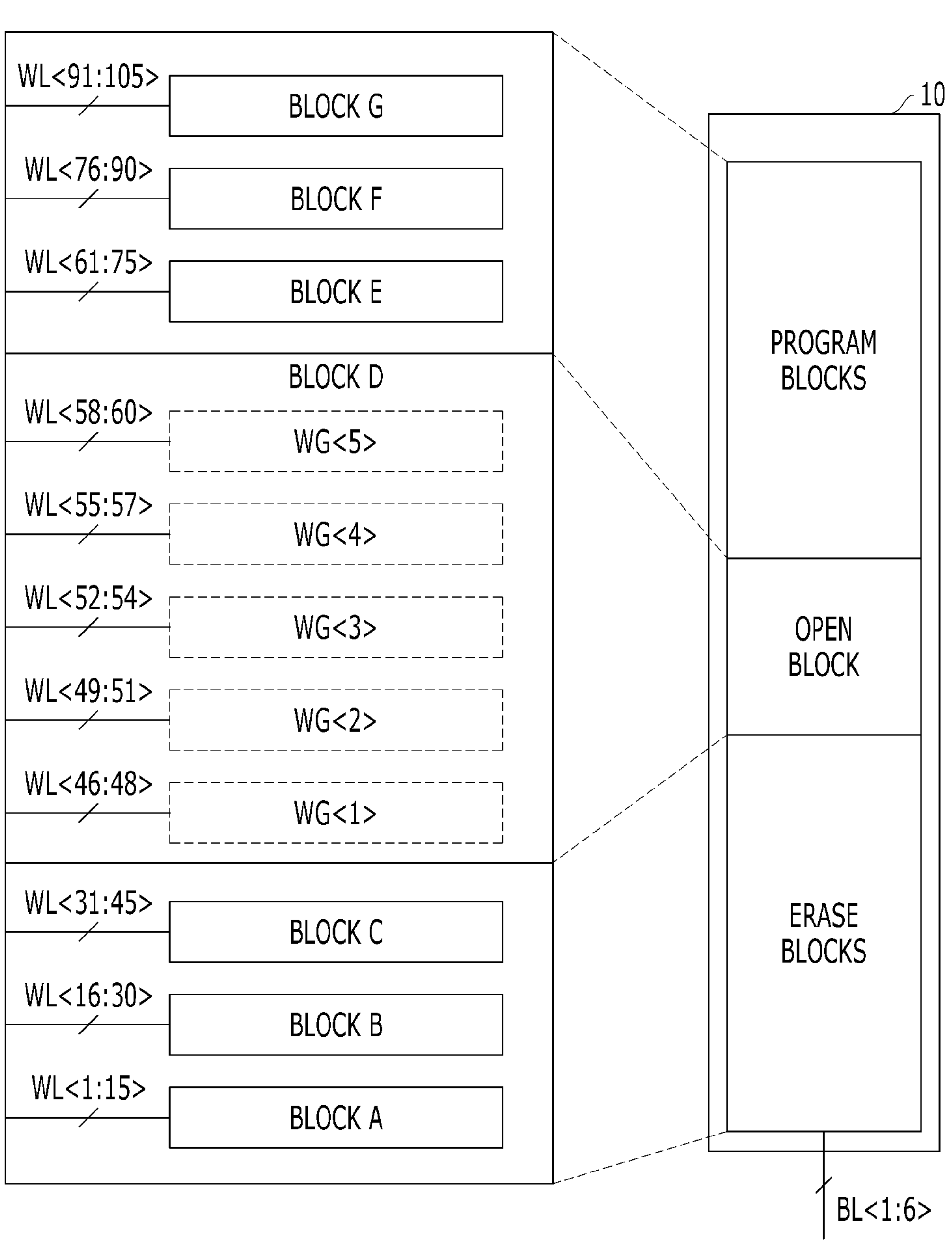
FIG. 2 is a diagram for describing a detailed configuration of a memory cell array among components of the memory device in accordance with the first embodiment of the present disclosure illustrated in FIG. 1.

Various embodiments of the present disclosure are described below with reference to the accompanying drawings. Elements and features of the disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim do not foreclose the apparatus from including additional components (e.g., an interface unit, circuitry, etc.).

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational (e.g., is not turned on nor activated). The block/unit/circuit/component used with the "configured to" language includes hardware, for example, circuits, memory storing program instructions executable to implement the operation, etc. Additionally, "configured to" can include a generic structure (e.g., generic circuitry) that is manipulated by software and/or firmware (e.g., an FPGA or a general-purpose processor executing software) to operate in a manner that is capable of performing the task(s) at issue. "Configured to" may also include adapting a manufacturing process (e.g., a semiconductor fabrication facility) to fabricate devices (e.g., integrated circuits) that implement or perform one or more tasks.

As used in the disclosure, the term 'circuitry' or 'logic' refers to all of the following: (a) hardware-only circuit implementations (such as implementations in only analog and/or digital circuitry) and (b) combinations of circuits and software (and/or firmware), such as (as applicable): (i) to a combination of processor(s) or (ii) to portions of processor (s)/software (including digital signal processor(s)), software, and memory(ies) that work together to cause an apparatus, such as a mobile phone or server, to perform various functions and (c) circuits, such as a microprocessor(s) or a portion of a microprocessor(s), that require software or firmware for operation, even if the software or firmware is not physically present. This definition of 'circuitry' or 'logic' applies to all uses of this term in this application, including in any claims. As a further example, as used in this application, the term "circuitry" or "logic" also covers an implementation of merely a processor (or multiple processors) or a portion of a processor and its (or their) accompanying software and/or firmware. The term "circuitry" or "logic" also covers, for example, and if applicable to a particular claim element, an integrated circuit for a storage device.

As used herein, the terms "first," "second," "third," and so on are used as labels for nouns that the terms precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. For example, the phrase "determine A based on B." While in this case, B is a factor that affects the determination of A, such a phrase does not foreclose the determination of A from also being based on C. In other instances, A may be determined based solely on B.

Herein, an item of data, a data item, a data entry or an entry of data may be a sequence of bits. For example, the data item may include the contents of a file, a portion of the file, a page in memory, an object in an object-oriented program, a digital message, a digital scanned image, a part of a video or audio signal, metadata or any other entity which can be represented by a sequence of bits. According to an embodiment, the data item may include a discrete object. According to another embodiment, the data item may include a unit of information within a transmission packet between two different components.

First Embodiment

FIG. 1 is a diagram for describing an example of a memory device which self-searches for a boundary word line, in accordance with a first embodiment of the present disclosure.

FIG. 2 is a diagram for describing a detailed configuration of a memory cell array among components of the memory device in accordance with the first embodiment of the present disclosure illustrated in FIG. 1.

Figure 3:
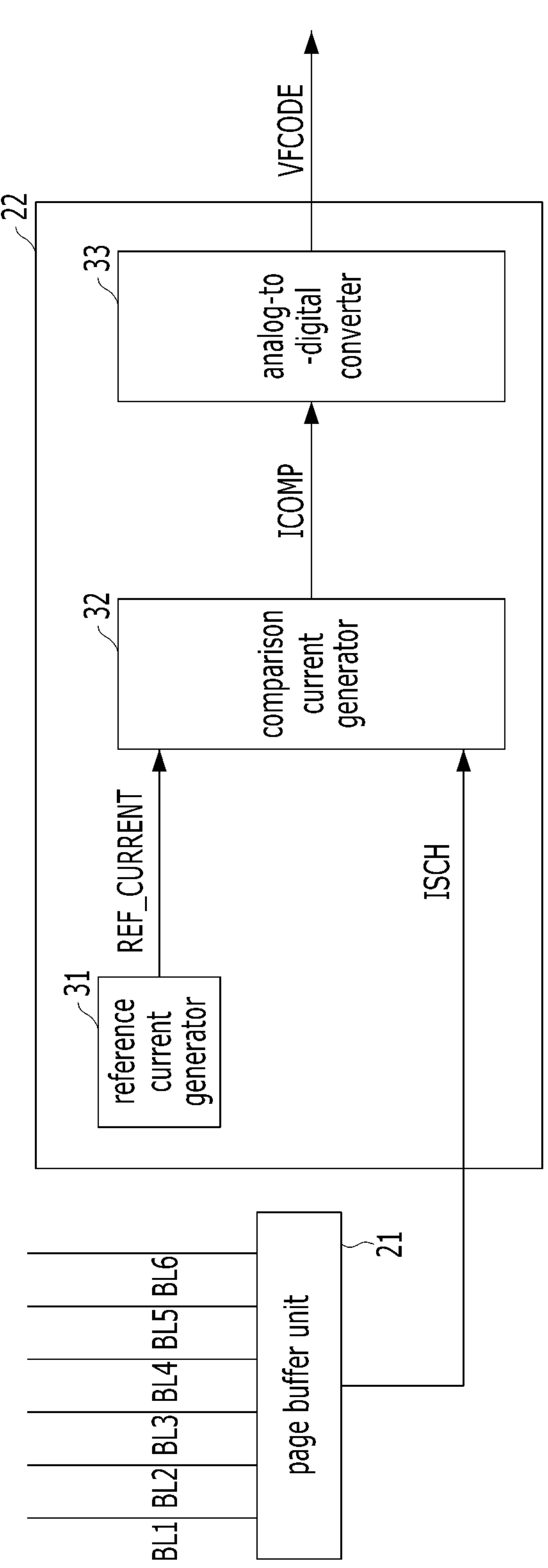
FIG. 3 is a diagram for describing a detailed configuration of a current comparison unit among the components of the memory device in accordance with the first embodiment of the present disclosure illustrated in FIG. 1.

FIG. 3 is a diagram for describing a detailed configuration of a current comparison unit among the components of the memory device in accordance with the first embodiment of the present disclosure illustrated in FIG. 1.

Referring to FIG. 1, a memory device 150 may include a memory cell array 10 and a control circuit 20. The control circuit 20 may include a page buffer unit 21, a current comparison unit 22 and a control logic unit 23.

Referring to FIG. 2 together with FIG. 1, the memory cell array 10 may include a plurality of memory blocks BLOCK<A:G>. Each of the plurality of memory blocks BLOCK<A:G> may include a plurality of pages (not illustrated) each including a plurality of memory cells (not illustrated).

One memory block may be understood as a group of a plurality of memory cells from which data are removed together through an erase operation. One page may be understood as a grouping, in a logical viewpoint, of a plurality of memory cells in which data are stored together in a program operation or from which data are outputted together in a read operation.

Unlike the logical viewpoint such as in the program operation or the read operation, from a physical viewpoint, pluralities of word lines WL<1:15>, WL<16:30>, WL<31:45>, WL<46:60>, WL<61:75>, WL<76:90> and WL<91:105> may be included in the plurality of memory blocks BLOCK<A:G>, respectively. That is, one word line may correspond to at least one page depending on the number of bits which may be stored or expressed in one memory cell. For example, when each memory cell is a single level cell (SLC) which stores one bit of data, one word line may correspond to one page. When each memory cell is a double level cell (DLC) which stores two bits of data, one word line may correspond to two pages. When each memory cell is a triple level cell (TLC) which stores three bits of data, one word line may correspond to three pages. When each memory cell is a quadruple level cell (QLC) which stores four bits of data, one word line may correspond to four pages. In this way, when each memory cell is a multiple level cell which stores five or more bits of data, one word line may correspond to five or more pages.

In more detail, the plurality of memory blocks BLOCK<A:G> included in the memory cell array 10 may be identified as one state of several states, that is, one state among a program state, an erase state and an open state. Each of a plurality of memory blocks BLOCK<E:G> which is in a program state may mean a memory block in which a program operation is completed, that is, a memory block in which data are stored in corresponding memory cells. Each of a plurality of memory blocks BLOCK<A:C> which is in an erase state may mean a memory block in which a program operation is not started, that is, a memory block in which data are not stored in corresponding memory cells. The memory block BLOCK D which is in an open state may mean a memory block in which a program operation is being performed, that is, a memory block in which data are stored in memory cells of some word lines and data are not stored in memory cells of the other word lines.

For reference, it may be seen from the drawing that the pluralities of 15 word lines WL<1:15>, WL<16:30>, WL<31:45>, WL<46:60>, WL<61:75>, WL<76:90> and WL<91:105> and six bit lines BL<1:6> are included in the plurality of memory blocks BLOCK<A:G> included in the memory cell array 10. However, this is for the sake of convenience in description, and it may be envisaged without limit that a larger number of word lines and a larger number of bit lines are included in one memory block. It may be seen that the pluralities of 15 word lines WL<1:15>, WL<16:30>, WL<31:45>, WL<46:60>, WL<61:75>, WL<76:90> and WL<91:105> included in the plurality of memory blocks BLOCK<A:G>, respectively, included in the memory cell array 10 are connected by sharing the six bit lines BL<1:6>. Therefore, the plurality of memory blocks BLOCK<A:G> included in the memory cell array 10 cannot simultaneously perform a read or write operation. For example, during a period in which a write operation is performed in a memory block in an open state, a read operation cannot be performed in a memory block in a program state or a write operation cannot be performed in a memory block in an erase state.

Referring back to FIG. 1, the control circuit 20 may enter a search mode in response to a search command SCCMD which is inputted from the outside (C1).

In an entry period of the search mode, the control circuit 20 may divide the plurality of word lines included in the memory cell array 10 into a plurality of groups by grouping the plurality of word lines by a set number of at least two (C2). In more detail, in an entry period of the search mode, the control circuit 20 may divide the plurality of word lines, e.g., one of {WL<1:15>, WL<16:30>, WL<31:45>, WL<46:60>, WL<61:75>, WL<76:90>, WL<91:105>} included in any one block, e.g., one of BLOCK<A:G> which is in an open state among the plurality of memory blocks BLOCK<A:G> included in the memory cell array 10, into a plurality of groups WG<1:5>, by grouping the plurality of word lines by the set number of at least two. For reference, before entering the search mode, the control circuit 20 may be aware of which memory block among the plurality of memory blocks BLOCK<A:G> included in the memory cell array 10 is in an open state. The control circuit 20 may be in a state in which information on a memory block in an open state is received before the search command SCCMD is inputted from the outside.

For example, as illustrated in the drawing, the 15 word lines WL<46:60> included in the fourth memory block BLOCK D may be divided into five groups WG<1:5> by being grouped into three word lines WL<46:48, 49:51, 52:54, 55:57, 58:60>. For another example, unlike the illustration of the drawing, the 15 word lines WL<16:30> included in the second memory block BLOCK B may be divided into five groups WG<1:5> by being grouped into three word lines WL<16:18, 19:21, 22:24, 25:27, 28:30>. For reference, in the above description, a configuration in which 15 word lines are included in one memory block and are divided into five groups by being grouped into three word lines has been illustrated. However, this is nothing but a mere example, and actually, it may also be envisaged without limit that more or less than 15 word lines are included in one memory block and are divided into more or less than five groups by being grouped into more or less than threes.

The control circuit 20 may select a search group one by one through a group-based binary search method for the plurality of groups WG<1:5> (C3). In more detail, after the search command SCCMD is inputted from the outside, the control circuit 20 may select an initial search group among the plurality of groups WG<1:5> in response to select information SELINFO which is subsequently inputted from the outside (C3). Namely, after entering the search mode in response to the search command SCCMD, the control circuit 20 may select an initial search group in response to the select information SELINFO. After selecting an initial search group, the control circuit 20 may reselect a search group through the group-based binary search method, if necessary. The reselected search group may be different from the initial search group.

For example, the control circuit 20 may select all five groups WG<1:5> as a binary search target in response to the select information SELINFO, and then, may select the third group WG<3> located in the middle among the five groups WG<1:5> selected as the binary search target, as an initial search group. Thereafter, when selecting a search group again as needed, the control circuit 20 may select the second group WG<2> which is located between the third group WG<3> and the first group WG<1>, as a second search group, according to the group-based binary search method. For another example, the control circuit 20 may select the first to fourth groups WG<1:4> among the five groups WG<1:5> as a binary search target in response to the select information SELINFO, and then, may select the second group WG<2> located in the middle among the first to fourth groups WG<1:4> selected as the binary search target, as an initial search group. Thereafter, when selecting a search group again as needed, the control circuit 20 may select the third group WG<3> which is located between the second group WG<2> and the fourth group WG<4>, as a second search group.

Each time when selecting a search group among the plurality of groups WG<1:5>, the control circuit 20 may perform a checking operation on the basis of the magnitude of a search current ISCH flowing through the plurality of bit lines BL<1:6> in a state in which a detection voltage VVF is applied simultaneously to all word lines of the search group (C4). That is, the control circuit 20 may perform the checking operation on the basis of the magnitude of the search current ISCH flowing through the plurality of bit lines BL<1:6> in a state in which the detection voltage VVF is applied simultaneously to all word lines of the search group among the plurality of groups WG<1:5> and a pass voltage VPS is applied to all word lines of the other groups except the search group. A period in which the detection voltage VVF is applied to the search group and a period in which the pass voltage VPS is applied to the other groups may be the same period.

For example, when the third group WG<3> is a search group, the control circuit 20 may perform the checking operation on the basis of the magnitude of the search current ISCH flowing through the plurality of bit lines BL<1:6> in a state in which the detection voltage VVF is applied to the three word lines WL<52:54> included in the third group WG<3> and the pass voltage VPS is applied to the 12 word lines WL<46:51, 55:60> included in the first, second, fourth and fifth groups WG<1:2, 4:5>. For another example, when the fifth group WG<5> is a search group, the control circuit 20 may perform the checking operation on the basis of the magnitude of the search current ISCH flowing through the plurality of bit lines BL<1:6> in a state in which the detection voltage VVF is applied to the three word lines WL<58:60> included in the fifth group WG<5> and at the same time the pass voltage VPS is applied to the 12 word lines WL<46:57> included in the first to fourth groups WG<1:4>.

In more detail, by performing the checking operation on the search group, the control circuit 20 may simultaneously check whether a boundary word line exists among the word lines of the search group and at which location the boundary word line is located among the word lines of the search group. The boundary word line may mean a word line in an erase state which is successively adjacent to a word line in a program state or may mean a word line in a program state which is successively adjacent to a word line in an erase state.

By performing the checking operation on the search group, the control circuit 20 may identify the state of the search group as one of the following two states.

A first state of the search group that may be identified in the checking operation is a state in which a boundary word line does not exist among the word lines of the search group.

Namely, since the first state of the search group is a state in which a boundary word line does not exist among the word lines of the search group, the first state of the search group may mean a state in which the location of a boundary word line cannot be checked in the checking operation.

For example, as a result of performing the checking operation on the third group WG<3> in which all of the three word lines WL<52:54> included therein are in a program state, the control circuit 20 may check that the third group WG<3> is in the first state in which a boundary word line does not exist. For another example, as a result of performing the checking operation on the first group WG<1> in which all of the three word lines WL<46:48> included therein are in an erase state, the control circuit 20 may check that the first group WG<1> is in the first state in which a boundary word line does not exist.

A second state of the search group that may be identified in the checking operation is a state in which it is possible to know which word line among the word lines of the search group exists as a boundary word line. Since the second state of the search group is a state in which a boundary word line exists among the word lines of the search group, the second state of the search group may mean a state in which the existence and location of a boundary word line can be simultaneously checked in the checking operation.

For example, as a result of performing the checking operation on the second group WG<2> in which, among the three word lines WL<49:51> included in the second group WG<2>, one word line WL<49> is in a program state and the other two word lines WL<50:51> are in an erase state, the control circuit 20 may check that a boundary word line in an erase state is the second word line WL<50> of the second group WG<2>. For another example, as a result of performing the checking operation on the fourth group WG<4> in which, among the three word lines WL<55:57> included in the fourth group WG<4>, one word line WL<55> is in a program state and the other two word lines WL<56:57> are in an erase state, the control circuit 20 may check that a boundary word line in a program state is the first word line WL<55> of the fourth group WG<4>.

When a state in which a boundary word line does not exist, that is, the first state of the search group, is checked in the checking operation on the search group, the control circuit 20 may perform a checking operation again by reselecting a search group according to the binary scan method (C5).

For example, the control circuit 20 may select all five groups WG<1:5> as a binary search target in response to the select information SELINFO and select the third group WG<3> located in the middle as an initial search group, and then, may perform a checking operation on the third group WG<3>. When a state in which a boundary word line is not included in the word lines of the third group WG<3>, that is, the first state, is checked as a result of performing the checking operation on the third group WG<3>, the control circuit 20 may select the second group WG<2> as a second search group according to the group-based binary search method. For another example, the control circuit 20 may select the first to fourth groups WG<1:4> among the five groups WG<1:5> as a binary search target in response to the select information SELINFO and select the second group WG<2> located in the middle as an initial search group, and then, may perform a checking operation on the second group WG<2>. When a state in which a boundary word line is not included in the word lines of the second group WG<2>, that is, the first state, is checked as a result of performing the checking operation on the second group WG<2>, the control circuit 20 may select the third group WG<3> as a second search group according to the group-based binary search method.

When the location of a boundary word line is checked in the checking operation on the search group, the control circuit 20 may generate location information LCINFO and output the location information LCINFO to the outside, and then, may exit the search mode (C6). When a state in which the existence and location of a boundary word line are simultaneously checked, that is, the second state of the search group, is identified in the checking operation on the search group, the control circuit 20 may generate the location information LCINFO and output the location information LCINFO to the outside, and then, may exit the search mode.

The location information LCINFO may be information indicating which word line of which block among the plurality of memory blocks BLOCK<A:G> included in the memory cell array 10 is a boundary word line. For example, when the second word line WL<59> of the fifth group WG<5> is checked as a boundary word line in the checking operation, the location information LCINFO may be information indicating that the 14th word line WL<59> of the fourth memory block BLOCK D is a boundary word line. For another example, when the first word line WL<49> of the second group WG<2> is checked as a boundary word line in the checking operation, the location information LCINFO may be information indicating that the fourth word line WL<49> of the fourth memory block BLOCK D is a boundary word line.

In an entry period of the search mode, according to the operation of the control circuit 20, that is, an operation of applying the detection voltage VVF simultaneously to all word lines of a search group among the plurality of groups WG<1:5> and applying the pass voltage VPS to all word lines of the other groups except the search group, the page buffer unit 21 included in the control circuit 20 may sum currents flowing through the plurality of bit lines BL<1:6>, respectively, and may output a search current ISCH.

In an embodiment, the page buffer unit 21 may include a plurality of page buffers which are connected to the plurality of bit lines BL<1:6>, respectively, and may be a component for, in a normal operation such as a write operation for storing write data, stored in the plurality of page buffers, in a plurality of memory cells through the plurality of bit lines BL<1:6> or a read operation for buffering read data received from the plurality of bit lines BL<1:6> and outputting the buffered read data to the outside. However, since an operation of reading or writing data through the page buffer unit 21 is not performed in the search mode disclosed in the present disclosure, a detailed description thereof will be omitted herein.

The current comparison unit 22 included in the control circuit 20 may be connected to the page buffer unit 21, may compare the magnitude of the search current ISCH and the magnitude of a reference current REF_CURRENT in the entry period of the search mode, and may generate a detection code VFCODE by varying the value thereof according to a comparison result.

In more detail, referring to FIG. 3 together with FIG. 1, the current comparison unit 22 included in the control circuit 20 may include a reference current generator 31, a comparison current generator 32 and an analog-to-digital converter 33.

The reference current generator 31 may generate the reference current REF_CURRENT. In an embodiment, the magnitude of the reference current REF_CURRENT may be adjusted as much as desired according to a designer's choice. For example, various control signals (not illustrated) for controlling an operation according to the type and operation method of the memory device 150 may be inputted to the reference current generator 31, and the reference current generator 31 may adjust the magnitude of the reference current REF_CURRENT according to the various control signals. Since a circuit configuration for adjusting the magnitude of the reference current REF_CURRENT in the reference current generator 31 is a technology already known in the art, a detailed description thereof will be omitted herein.

The comparison current generator 32 may generate a comparison current ICOMP which is variable depending on a difference between the magnitude of the search current ISCH and the magnitude of the reference current REF_CURRENT. Namely, the comparison current generator 32 may determine the magnitude of the comparison current ICOMP as an analog value through an operation of comparing the magnitude of the search current ISCH with the magnitude of the reference current REF_CURRENT to know the difference therebetween in an analog value and whether the difference is large or small.

For example, the comparison current generator 32 may determine an analog value obtained by subtracting the analog value of the reference current REF_CURRENT from the analog value of the search current ISCH, as the comparison current ICMP. For reference, through which operation the magnitudes of the search current ISCH and the reference current REF_CURRENT are to be compared to know the difference therebetween and in which scheme a result thereof is to be applied to the comparison current ICOMP may be adjusted as much as desired according to the designer's choice.

The analog-to-digital converter 33 may convert the comparison current ICOMP into the detection code VFCODE. That is, the analog-to-digital converter 33 may convert the comparison current ICOMP being an analog value into the detection code VFCODE being a digital value. The magnitude of the comparison current ICOMP being an analog value to be converted into the detection code VFCODE being a digital value may be adjusted as much as desired according to the designer's choice.

Referring back to FIG. 1, the control logic unit 23 included in the control circuit 20 may enter the search mode in response to the search command SCCMD which is inputted from the outside (C1).

In an entry period of the search mode, the control logic unit 23 may divide a plurality of word lines included in the memory cell array 10 into the plurality of groups WG<1:5> by grouping the plurality of word lines by the set number of at least two (C2). In an entry period of the search mode, the control logic unit 23 may divide the plurality of word lines, e.g., one of {WL<1:15>, WL<16:30>, WL<31:45>, WL<46:60>, WL<61:75>, WL<76:90>, WL<91:105>} included in any one block, e.g., one of BLOCK<A:G> which is in an open state among the plurality of memory blocks BLOCK<A:G> included in the memory cell array 10, into the plurality of groups WG<1:5>, by grouping the plurality of word lines by the set number of at least two.

The control logic unit 23 may select a search group one by one through the group-based binary search method for the plurality of groups WG<1:5> (C3). In more detail, after the search command SCCMD is inputted from the outside, the control logic unit 23 may select an initial search group among the plurality of groups WG<1:5> in response to the select information SELINFO which is subsequently inputted from the outside (C3). Namely, after entering the search mode in response to the search command SCCMD, the control logic unit 23 may select an initial search group in response to the select information SELINFO. After selecting an initial search group, the control logic unit 23 may reselect a search group through the group-based binary search method according to a result of a checking operation. The reselected search group may be different from the initial search group.

Each time when selecting a search group among the plurality of groups WG<1:5>, the control logic unit 23 may apply the detection voltage VVF simultaneously to all word lines of the search group, and then, may perform a checking operation on the basis of the value of the detection code VFCODE generated in the current comparison unit 22 (C4). The control logic unit 23 may apply the detection voltage VVF simultaneously to all word lines of the search group among the plurality of groups WG<1:5> and apply the pass voltage VPS to all word lines of the other groups except the search group, and then, may perform the checking operation on the basis of the value of the detection code VFCODE generated in the current comparison unit 22. A period in which the detection voltage VVF is applied to the search group and a period in which the pass voltage VPS is applied to the other groups may be the same period.

When a state in which a boundary word line does not exist, that is, the first state of the search group, is checked in the checking operation on the search group, the control logic unit 23 may perform a checking operation again by reselecting a search group according to the binary scan method (C5).

When the location of a boundary word line is checked in the checking operation on the search group, the control logic unit 23 may generate location information LCINFO and output the location information LCINFO to the outside, and then, may exit the search mode (C6). When a state in which the existence and location of a boundary word line are simultaneously checked, that is, the second state of the search group, is identified in the checking operation on the search group, the control logic unit 23 may generate the location information LCINFO and output the location information LCINFO to the outside, and then, may exit the search mode.

For reference, the outside of the memory device 150 may exist a component such as a memory controller (not illustrated) or a host (not illustrated) for controlling an operation of the memory device 150. That is, the control circuit 20 may be inputted the search command SCCMD from the memory controller or the host, which exist the outside of the memory device, and may output the location information LCINFO to the memory controller or the host which exist the outside of the memory device.

Figure 4:
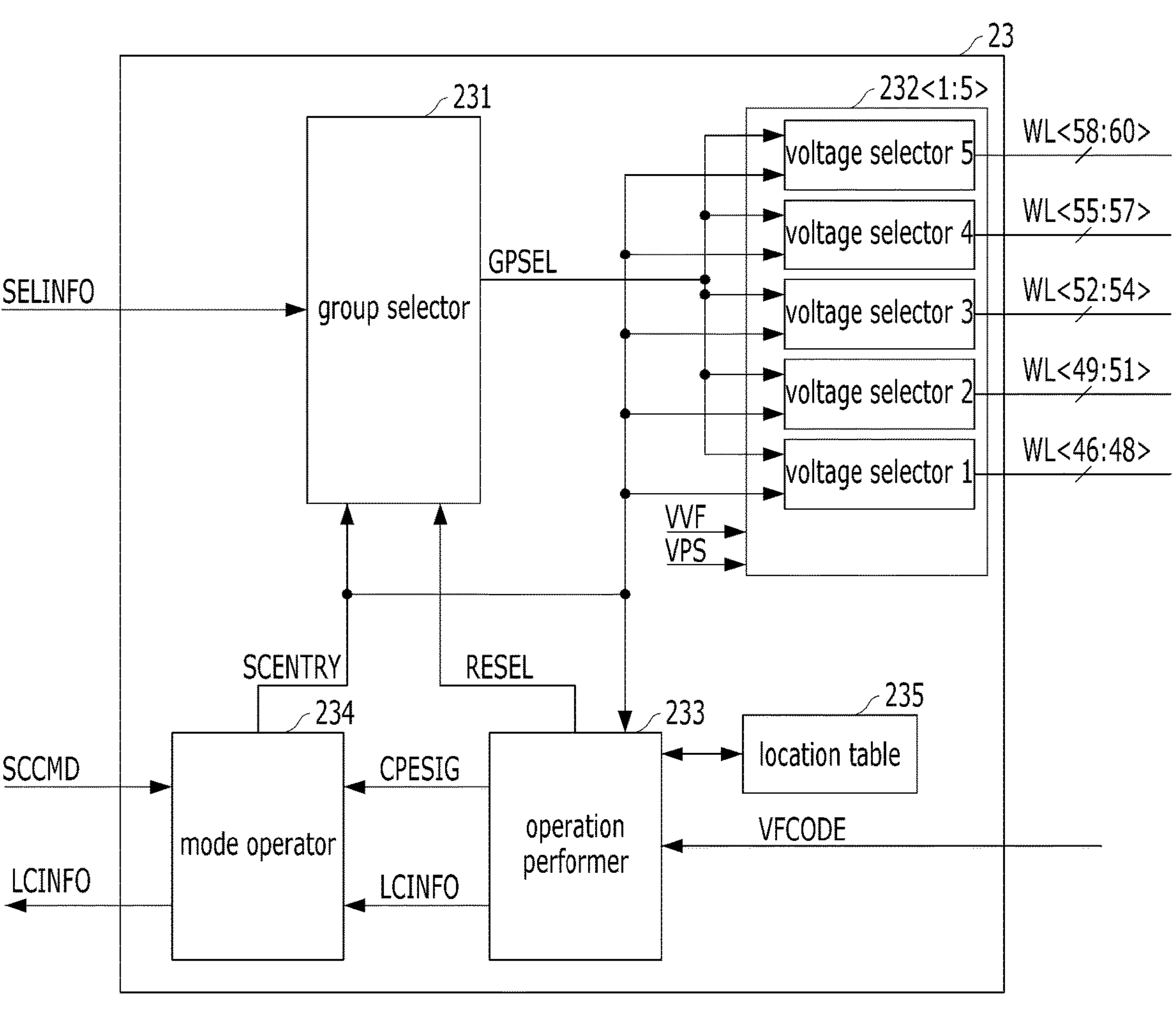
FIG. 4 is a diagram for describing a detailed configuration of a control logic unit among the components of the memory device in accordance with the first embodiment of the present disclosure illustrated in FIG. 1.

FIG. 4 is a diagram for describing a detailed configuration of a control logic unit among the components of the memory device in accordance with the first embodiment of the present disclosure illustrated in FIG. 1.

Figure 5:
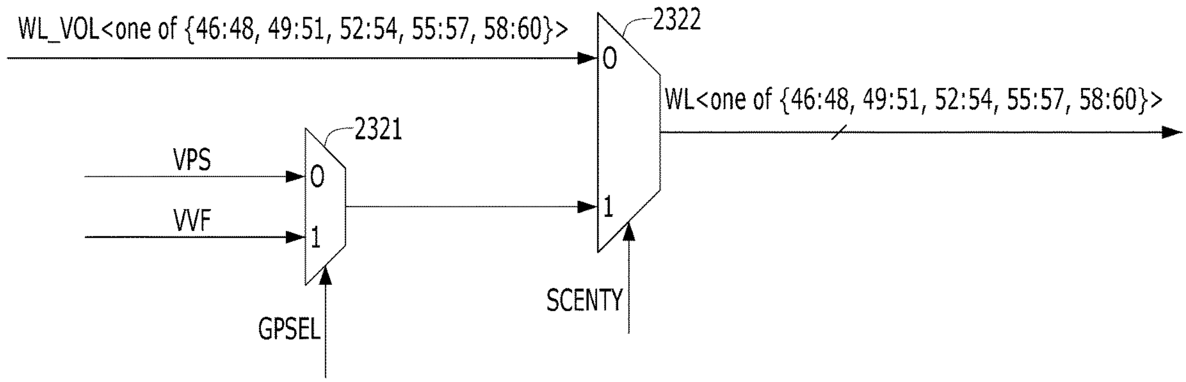
FIG. 5 is a diagram for describing a detailed configuration of a plurality of voltage selectors included in the control logic unit among the components of the memory device in accordance with the first embodiment of the present disclosure illustrated in FIG. 1.

FIG. 5 is a diagram for describing a detailed configuration of a plurality of voltage selectors included in the control logic unit among the components of the memory device in accordance with the first embodiment of the present disclosure illustrated in FIG. 1.

FIG. 6 is a diagram for describing a detailed configuration of a location table included in the control logic unit among the components of the memory device in accordance with the first embodiment of the present disclosure illustrated in FIG. 1.

Referring to FIG. 4, the control logic unit 23 may include a group selector 231, a plurality of voltage selectors 232<1:5>, an operation performer 233, a mode operator 234, and a location table 235.

The group selector 231 may select an initial search group in response to the select information SELINFO inputted from the outside, in a state in which a search entry signal SCENTRY is activated. The group selector 231 may reselect a search group in response to a reselect signal RESEL, in a state in which the search entry signal SCENTRY is activated.

For example, the group selector 231 may select all five groups WG<1:5> as a binary search target in response to the select information SELINFO, in a state in which the search entry signal SCENTRY is activated, and then, may select the third group WG<3> located in the middle among the five groups WG<1:5> selected as the binary search target, as an initial search group. Thereafter, the group selector 231 may select the second group WG<2> which is located between the third group WG<3> and the first group WG<1>, as a second search group, according to the group-based binary search method in response to the reselect signal RESEL, in a state in which the search entry signal SCENTRY is activated. For another example, the group selector 231 may select the first to fourth groups WG<1:4> among the five groups WG<1:5> as a binary search target in response to the select information SELINFO, in a state in which the search entry signal SCENTRY is activated, and then, may select the second group WG<2> located in the middle among the first to fourth groups WG<1:4> selected as the binary search target, as an initial search group. Thereafter, the group selector 231 may select the third group WG<3> which is located between the second group WG<2> and the fourth group WG<4>, as a second search group, according to the group-based binary search method in response to the reselect signal RESEL, in a state in which the search entry signal SCENTRY is activated.

Each time when selecting a search group in a state in which the search entry signal SCENTRY is activated, the group selector 231 may generate a group select signal GPSEL for identifying the plurality of groups WG<1:5> as one search group and the other groups except the search group.

For example, the group select signal GPSEL generated in the group selector 231 may be a signal which includes 1-bit information, and a group to which the group select signal GPSEL having a value of '1' is inputted among the plurality of groups WG<1:5> may be selected as a search group and groups to which the group select signal GPSEL having a value of '0' is inputted may be selected as the other groups. Since the group selector 231 identifies only one group among the five groups WG<1:5> as a search group and identifies the other four groups as the other groups, the group selector 231 may generate and output one group select signal GPSEL with a value of '1' and four group select signals GPSEL with a value of '0.'

Referring to FIGS. 4 and 5 together, the plurality of voltage selectors 232<1:5> may correspond to the plurality of groups WG<1:5>, respectively. Each of the plurality of voltage selectors 232<1:5> may select one voltage between the detection voltage VVF and the pass voltage VPS in response to the group select signal GPSEL, in a state in which the search entry signal SCENTRY is activated and may apply the selected voltage simultaneously to all word lines of a corresponding group.

According to an embodiment, each of the plurality of voltage selectors 232<1:5> may include one first multiplexer 2321 and a set number of second multiplexers 2322.

For example, when, as in shown in the drawings, the 15 word lines WL<46:60> included in one memory block BLOCK<D> which is in an open state are divided into five groups WG<1:5> by grouping the 15 word lines WL<46:60> into three word lines WL<46:48, 49:51, 52:54, 55:57, 58:60>, five voltage selectors 232<1:5> may exist in correspondence to the five groups WG<1:5>. Also, since three word lines WL<one of {46:48, 49:51, 52:54, 55:57, 58:60}> are included in each of the five groups WG<1:5>, each of the five voltage selectors 232<1:5> may include one first multiplexer 2321 and three second multiplexers 2322.

The first multiplexer 2321 may select one of the detection voltage VVF and the pass voltage VPS in response to the group select signal GPSEL.

For example, the first multiplexer 2321 may select and output the detection voltage VVF in response to the group select signal GPSEL having a value of '1.' For another example, the first multiplexer 2321 may select and output the pass voltage VPS in response to that the group select signal GPSEL having a value of '0.'

The set number of second multiplexers 2322 may transfer the voltage VVF or VPS outputted from the one first multiplexer 2321, in a state in which the search entry signal SCENTRY is activated, simultaneously to all of the set number of word lines WL<one of {46:48, 49:51, 52:54, 55:57, 58:60}> included in a corresponding group WG<one of {1:5}>.

For example, in a state in which the search entry signal SCENTRY is activated, the detection voltage VVF selected through one first multiplexer 2321 and three second multiplexers 2322 may be applied simultaneously to three word lines included in one group selected as a search group among the five groups WG<1:5>. In addition, in a state in which the search entry signal SCENTRY is activated, the pass voltage VPS selected through four first multiplexers 2321 and 12 second multiplexers 2322 may be applied simultaneously to twelve word lines included in four groups selected as the other groups except the search group among the five groups WG<1:5>.

Conversely, in a state in which the search entry signal SCENTRY is deactivated, the set number of second multiplexers 2322 may transfer normal word line voltages WL_VOL<one of {46:48, 49:51, 52:54, 55:57, 58:60}> to the set number of word lines WL<one of {46:48, 49:51, 52:54, 55:57, 58:60}> included in a corresponding group WG<one of {1:5}>.

For example, in a state in which the search entry signal SCENTRY is deactivated, 15 normal word line voltages WL_VOL<46:48, 49:51, 52:54, 55:57, 58:60> may be applied to 15 word lines included in the five groups WG<1:5> through 15 second multiplexers 2322.

The normal word line voltages WL_VOL<46:48, 49:51, 52:54, 55:57, 58:60> may mean voltages transferred to the plurality of word lines, respectively, included in the memory block BLOCK<D> which is in an open state, for a normal operation such as a read operation, a write operation, or an erase operation.

For example, in a program operation, a program voltage may be applied to a word line which is selected as a program target among the plurality of word lines included in the memory block BLOCK<D> in an open state, and the pass voltage VPS may be applied to the other word lines except the word line as the program target.

Referring back to FIG. 4, the operation performer 233 included in the control logic unit 23 may perform the checking operation on the basis of the value of the detection code VFCODE generated by the current comparison unit 22, in a state in which the search entry signal SCENTRY is activated. Namely, in a state in which the detection voltage VVF is applied simultaneously to all word lines of a search group among the plurality of groups WG<1:5> and the pass voltage VPS is applied to all word lines of the other groups except the search group through the plurality of voltage selectors 232<1:5> in a state in which the search entry signal SCENTRY is activated, the operation performer 233 may perform the checking operation on the basis of the digital value of the detection code VFCODE which is determined by the operations of the page buffer unit 21 and the current comparison unit 22.

The operation performer 233 may generate a completion signal CPESIG and the location information LCINFO or the reselect signal RESEL depending on a result of the checking operation. The operation performer 233 may refer to the location table 235 to determine a result of the checking operation.

Referring to FIG. 6 together with FIG. 4, data indicating the location of a boundary word line corresponding to the digital value of the detection code VFCODE among word lines of a search group may be stored in the location table 235. That is, in the location table 235, maximum and minimum values of the detection code VFCODE which may be set and a set number of intermediate values may be predefined. In addition, in the location table 235, a result of the checking operation performed by the operation performer 233 may be predefined depending on the value of the detection code VFCODE.

Therefore, the operation performer 233 may search for the value of the detection code VFCODE inputted from the current comparison unit 22, in the location table 235, and may generate the completion signal CPESIG and the location information LCINFO or the reselect signal RESEL depending on a result of the checking operation corresponding to the searched value of the detection code VFCODE.

In more detail, the maximum value of the detection code VFCODE in the location table 235 may be defined as a state in which all word lines of the search group are in a program state, that is, the percentage of cells in a program state is 100%. Therefore, when the value of the detection code VFCODE inputted from the current comparison unit 22 is the maximum value defined in the location table 235, the operation performer 233 may determine the checking operation found that a boundary word line does not exist among the word lines of the search group. When determining the checking operation found that a boundary word line does not exist among the word lines of the search group, the operation performer 233 may generate the reselect signal RESEL.

The minimum value of the detection code VFCODE in the location table 235 may be defined as a state in which all of the word lines of the search group are in an erase state, that is, the percentage of cells in a program state is 0%. Therefore, when the value of the detection code VFCODE inputted from the current comparison unit 22 is the minimum value defined in the location table 235, the operation performer 233 may determine the checking operation found that a boundary word line does not exist among the word lines of the search group. When determining the checking operation found that a boundary word line does not exist among the word lines of the search group, the operation performer 233 may generate the reselect signal RESEL.

Each of the intermediate values between the maximum value and the minimum value in the location table 235 may be defined as a state in which a part of the word lines of the search group is in a program state and the other part is in an erase state, that is, the percentage of cells in the program state is greater than 0% and less than 100%, for example, 25%, 50% or 75%. Therefore, when the value of the detection code VFCODE inputted from the current comparison unit 22 is an intermediate value, the operation performer 233 may determine that a boundary word line exists among the word lines of the search group. By checking that the value of the detection code VFCODE inputted from the current comparison unit 22 is an intermediate value of which order in the location table 235, the operation performer 233 may determine which ordered location among the word lines of the search group is a boundary word line. The operation performer 233 may generate the completion signal CPESIG together with the location information LCINFO indicating that a boundary word line is located at which order among the word lines of the search group.

The location information LCINFO may be information indicating that which word line of which block among the plurality of memory blocks BLOCK<A:G> included in the memory cell array 10 is a boundary word line. For example, the operation performer 233 may determine through the checking operation that the second word line WL<59> of the fifth group WG<5> is a boundary word line. In this case, the operation performer 233 may generate the location information LCINFO indicating that the 14th word line WL<59> of the fourth memory block BLOCK D is a boundary word line.

A principle by which the operation performer 233 can determine the location of a boundary word line through the value of the detection code VFCODE is as follows.

First, each intermediate value of the detection code VFCODE included in the location table 235 may correspond to each word line included in the search group. In the above-described example, the reason why the three intermediate values of the detection code VFCODE are set is because the 'set number' being the number of word lines included in each of the plurality of groups WG<1:5> is three. Since only one group among the plurality of groups WG<1:5> may be selected as a search group, the intermediate values of the detection code VFCODE set as three intermediate values may correspond to three word lines, respectively, included in the search group. If the number of word lines included in each of the plurality of groups WG<1:5> is greater than three, the number of intermediate values of the detection code VFCODE may also be set to be greater than three.

For example, when the first group WG<1> among the plurality of groups WG<1:5> is selected as a search group, the intermediate values of the detection code VFCODE set as three intermediate values may correspond to the three word lines WL<46:48>, respectively, included in the first group WG<1>. For another example, when the third group WG<3> among the plurality of groups WG<1:5> is selected as a search group, the intermediate values of the detection code VFCODE set as three intermediate values may correspond to the three word lines WL<52:54>, respectively, included in the third group WG<3>.

In this way, since the intermediate values of the detection code VFCODE in the location table 235 correspond to the word lines, respectively, of the search group, the order of the intermediate values of the detection code VFCODE in the location table 235 may correspond to the location of a boundary word line among the word lines included in the search group.

For example, among digital values of the detection code VFCODE in the location table 235, the maximum value may be set to '100,' the minimum value may be set to '000,' and the intermediate values between the maximum value and the minimum value may be set to '001, 010 and 011.' Namely, in the location table 235, the order of the intermediate values of the detection code VFCODE may be '001,' '010' and '011.' In this case, the operation performer 233 may determine that the intermediate value of the detection code VFCODE of '001' in the checking operation corresponds to that a word line FIRST WL located first among the word lines included in the search group is a boundary word line. The operation performer 233 may determine that the intermediate value of the detection code VFCODE of '010' in the checking operation corresponds to that a word line SECOND WL located second among the word lines included in the search group is a boundary word line. The operation performer 233 may determine that the intermediate value of the detection code VFCODE of '011' in the checking operation corresponds to that a word line THIRD WL located third among the word lines included in the search group is a boundary word line.

The mode operator 234 included in the control logic unit 23 may activate the search entry signal SCENTRY in response to the search command SCCMD inputted from the outside. That is, the mode operator 234 may activate the search entry signal SCENTRY to enter the search mode in response to the search command SCCMD inputted from the outside. The mode operator 234 may output, to the outside, the location information LCINFO generated by the operation performer 233 in response to the completion signal CPESIG generated by the operation performer 233, and then, may deactivate the search entry signal SCENTRY. The mode operator 234 may deactivate the search entry signal SCENTRY to exit the search mode in response to the completion signal CPESIG. The mode operator 234 may output the location information LCINFO to the outside before deactivating the search entry signal SCENTRY in response to the completion signal CPESIG.

Figure 7A:
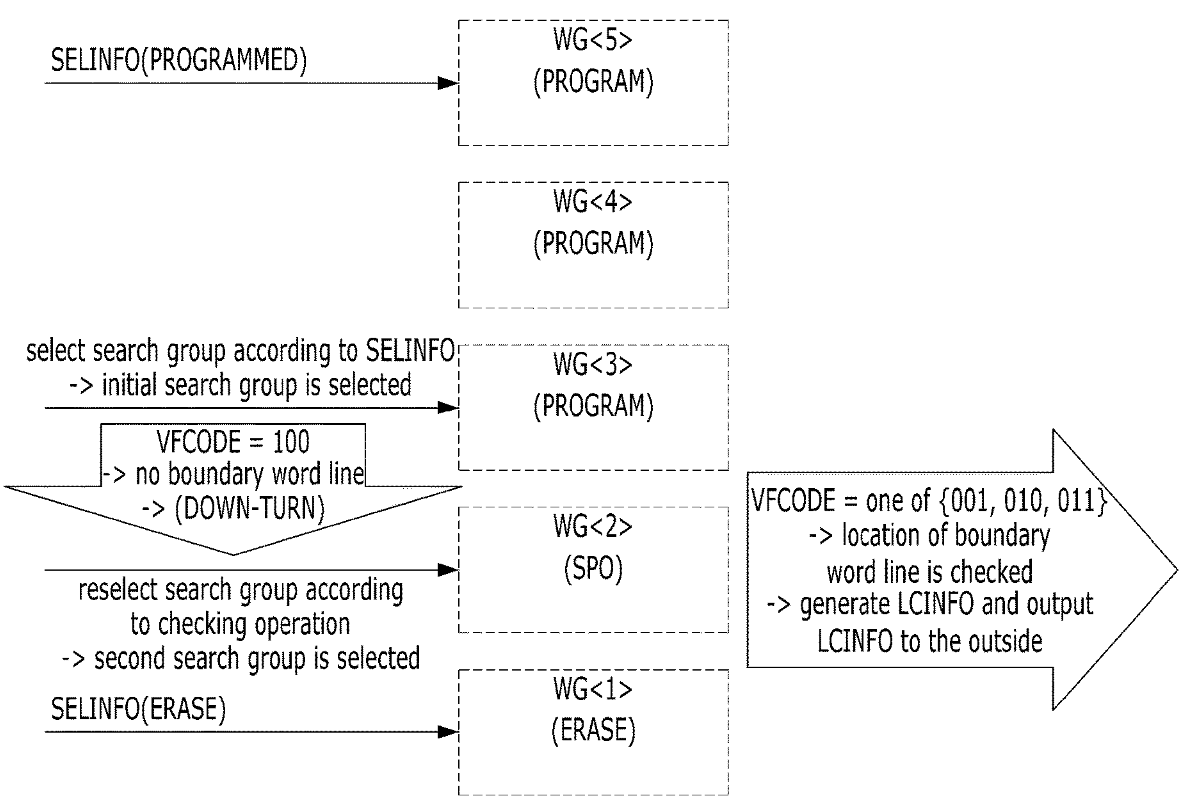
FIG. 7A is a diagram for describing an example of an operation of searching for a boundary word line in the memory device in accordance with the first embodiment of the present disclosure illustrated in FIG. 1.

FIG. 7A is a diagram for describing an example of an operation of searching for a boundary word line in the memory device in accordance with the first embodiment of the present disclosure illustrated in FIG. 1.

Referring to FIG. 7A, a plurality of word lines included in a memory block which is in an open state are divided into five groups WG<1:5> by grouping the plurality of word lines by a set number. In addition, a boundary word line is included in word lines of the second group WG<2> among the five groups WG<1:5>. Namely, an SPO has occurred while performing a program operation on a word line among the set number of word lines included in the second group WG<2>.

In this state, the search mode may be entered in response to the search command SCCMD inputted from the outside.

In response to the select information SELINFO inputted from the outside, in the state in which the search mode is entered, all five groups WG<1:5> may be selected as a binary search target. For example, according to the select information SELINFO, the first group WG<1> among the five groups WG<1:5> may be selected as an erase state, and the fifth group WG<5> may be selected as a program state.

Accordingly, an initial search group according to the select information SELINFO may be the third group WG<3> which is located in the middle among the five groups WG<1:5>.

After applying the detection voltage VVF to all word lines of the third group WG<3> selected as the initial search group and applying the pass voltage VPS to all word lines of the remaining first, second, fourth and fifth groups WG<1:2, 4:5>, the value of the detection code VFCODE may be determined on the basis of the magnitude of the search current ISCH obtained by summing currents flowing through the plurality of bit lines BL<1:6>, respectively.

Since the third group WG<3> is in a program state, the value of the detection code VFCODE determined for the third group WG<3> may be '100.' According to such a value of the detection code VFCODE, it may be checked that a boundary word line does not exist in the word lines of the third group WG<3>. Since it is checked that a boundary word line does not exist in the word lines of the third group WG<3> and the third group WG<3> is in a program state, the second group WG<2> located between the third group WG<3> and the first group WG<1> may be selected as a second search group by down-turning according to the group-based binary search method.

After applying the detection voltage VVF to all word lines of the second group WG<2> selected as the second search group and applying the pass voltage VPS to all word lines of the remaining first, third, fourth and fifth groups WG<1, 3:5>, the value of the detection code VFCODE may be determined on the basis of the magnitude of the search current ISCH obtained by summing currents flowing through the plurality of bit lines BL<1:6>, respectively.

Since a boundary word line is included in the word lines of the second group WG<2>, the value of the detection code VFCODE determined for the second group WG<2> may be one of '001, 010 and 011.' Depending on the value of the detection code VFCODE, it is possible to check not only a state in which a boundary word line is included in the word lines of the second group WG<2> but also which word line among the word lines of the second group WG<2> is a boundary word line. For example, when the value of the detection code VFCODE is '001,' it may be checked that a first word line included in the second group WG<2> is a boundary word line. For another example, when the value of the detection code VFCODE is '011,' it may be checked that a third word line included in the second group WG<2> is a boundary word line.

In this way, after checking which word line among the word lines of the second group WG<2> is a boundary word line, the location information LCINFO may be generated on the basis of a checked result, and the search mode may be exited after outputting the generated location information LCINFO to the outside.

Figure 7B:
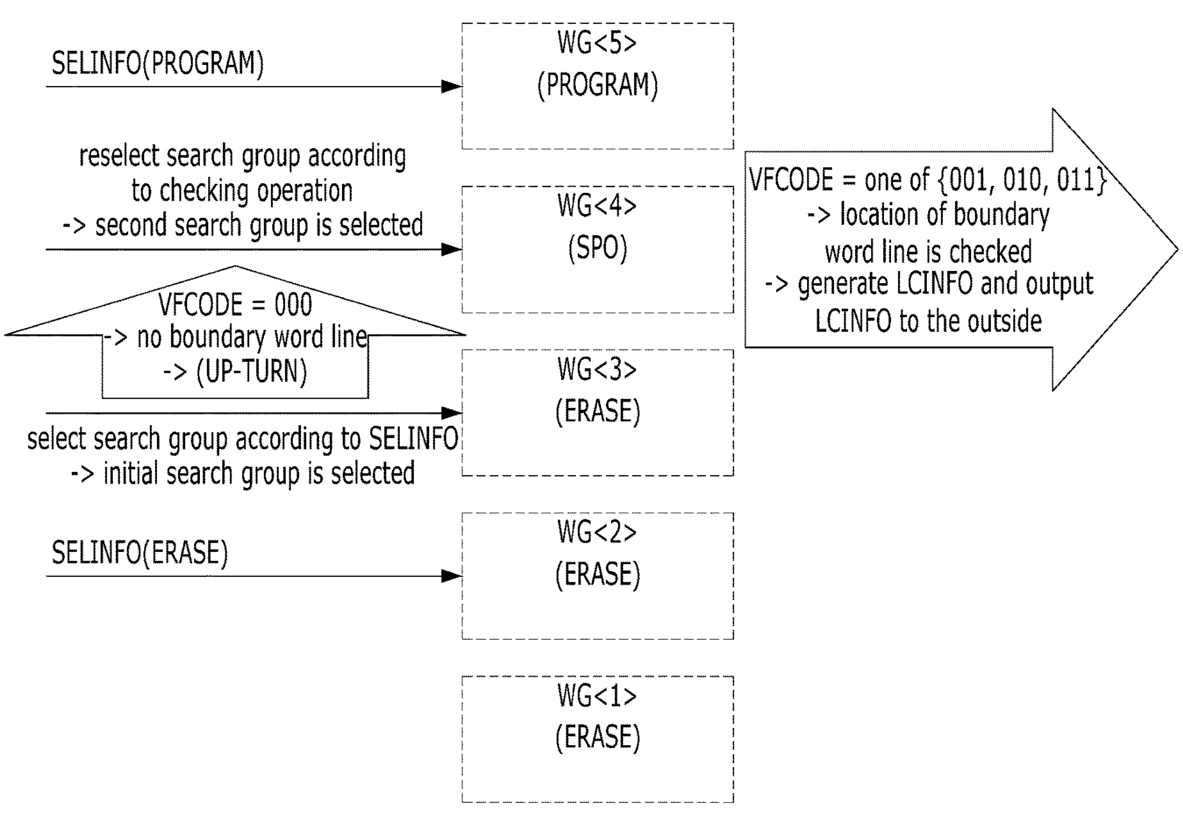
FIG. 7B is a diagram for describing another example of an operation of searching for a boundary word line in the memory device in accordance with the first embodiment of the present disclosure illustrated in FIG. 1.

FIG. 7B is a diagram for describing another example of an operation of searching for a boundary word line in the memory device in accordance with the first embodiment of the present disclosure illustrated in FIG. 1.

Referring to FIG. 7B, a plurality of word lines included in a memory block which is in an open state are divided into five groups WG<1:5> by grouping the plurality of word lines by a set number. In addition, a boundary word line is included in word lines of the fourth group WG<4> among the five groups WG<1:5>. Namely, an SPO has occurred while performing a program operation on a word line among the set number of word lines included in the fourth group WG<4>.

In this state, the search mode may be entered in response to the search command SCCMD inputted from the outside.

In response to the select information SELINFO inputted from the outside, in the state in which the search mode is entered, the second to fifth groups WG<2:5> among the five groups WG<1:5> may be selected as a binary search target. For example, according to the select information SELINFO, the second group WG<2> among the five groups WG<1:5> may be selected as an erase state, and the fifth group WG<5> may be selected as a program state.

Therefore, an initial search group according to the select information SELINFO may be one group of the third group WG<3> and the fourth group WG<4> located in the middle among the second to fifth groups WG<2:5>. Herein, the third group WG<3> is selected as an initial search group.

After applying the detection voltage VVF to all word lines of the third group WG<3> selected as the initial search group and applying the pass voltage VPS to all word lines of the remaining first, second, fourth and fifth groups WG<1:2, 4:5>, the value of the detection code VFCODE may be determined on the basis of the magnitude of the search current ISCH obtained by summing currents flowing through the plurality of bit lines BL<1:6>, respectively.

Since the third group WG<3> is in an erase state, the value of the detection code VFCODE determined for the third group WG<3> may be '000.' According to such a value of the detection code VFCODE, it may be checked that a boundary word line does not exist in the word lines of the third group WG<3>. Since it is checked that a boundary word line does not exist in the word lines of the third group WG<3> and the third group WG<3> is in an erase state, the fourth group WG<4> located between the third group WG<3> and the fifth group WG<5> may be selected as a second search group by up-turning according to the group-based binary search method.

After applying the detection voltage VVF to all word lines of the fourth group WG<4> selected as the second search group and applying the pass voltage VPS to all word lines of the remaining first to third and fifth groups WG<1:3, 5>, the value of the detection code VFCODE may be determined on the basis of the magnitude of the search current ISCH obtained by summing currents flowing through the plurality of bit lines BL<1:6>, respectively.

Since a boundary word line is included in the word lines of the fourth group WG<4>, the value of the detection code VFCODE determined for the fourth group WG<4> may be one of '001, 010 and 011.' Depending on the value of the detection code VFCODE, it is possible to check not only a state in which a boundary word line is included in the word lines of the fourth group WG<4> but also which word line among the word lines of the fourth group WG<4> is a boundary word line. For example, when the value of the detection code VFCODE is '010,' it may be checked that a second word line included in the fourth group WG<4> is a boundary word line.

In this way, after checking which word line among the word lines of the fourth group WG<4> is a boundary word line, the location information LCINFO may be generated on the basis of a checked result, and the search mode may be exited after outputting the generated location information LCINFO to the outside.

Figure 8:
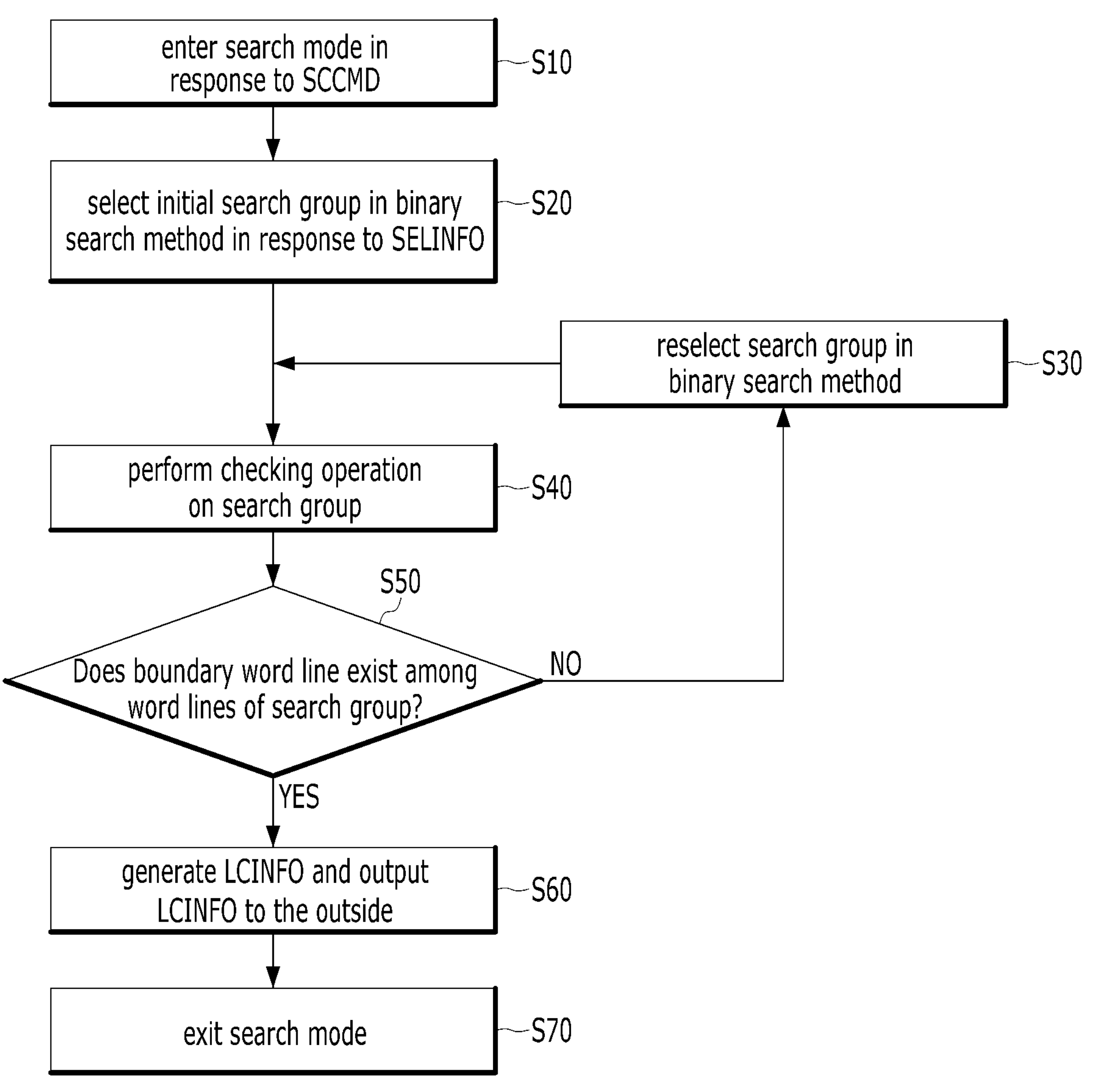
FIG. 8 is a flow chart for describing a sequence of the operation of searching for a boundary word line in the memory device in accordance with the first embodiment of the present disclosure illustrated in FIG. 1.

FIG. 8 is a flow chart for describing a sequence of the operation of searching for a boundary word line in the memory device in accordance with the first embodiment of the present disclosure illustrated in FIG. 1.

Referring to FIG. 8, the memory device 150 may enter the search mode in response to the search command SCCMD (S10).

In a period in which the search mode is entered through S10, a search group may be selected one by one, through the group-based binary search method, among the plurality of groups WG<1:5> obtained by grouping, by a set number of at least two, a plurality of word lines included in a memory block which is included in the memory device 150 and is in an open state (S20 and S30).

An operation of selecting an initial search group after entering the search mode through S10 may be performed according to the select information SELINFO inputted from the outside (S20).

Apart from selecting an initial search group at S20, a search group may need to be reselected as needed (S30).

In a state in which the detection voltage VVF is applied simultaneously to all word lines of the search group selected through S20 or S30, on the basis of the magnitude of the search current ISCH flowing through the plurality of bit lines BL<1:6>, a checking operation of simultaneously checking whether a boundary word line exists among the word lines of the search group and at which location the boundary word line is located among the word lines of the search group may be performed (S40). That is, in a state in which the detection voltage VVF is applied simultaneously to all word lines of the search group selected through S20 or S30 and at the same time the pass voltage VPS is applied simultaneously to all word lines of the remaining groups not selected through S20 or S30, the checking operation may be performed on the basis of the magnitude of the search current ISCH flowing through the plurality of bit lines BL<1:6>.

In the checking operation performed at S40, it is possible to check whether a boundary word line exists among the word lines of the search group (S50).

When it is determined that a boundary word line does not exist at S50 (NO of S50), a search group may be reselected through S30, and then, after a checking operation is performed on the search group through S40, a result of the checking operation may be checked at S50.

When it is determined that a boundary word line exists at S50 (YES of S50), that is, when it is checked which word line among the word lines of the search group is a boundary word line, the location information LCINFO may be generated depending on the checked location of the boundary word line and be outputted to the outside (S60).

After the location information LCINFO is outputted to the outside at S60, the search mode may be exited (S70).

Second Embodiment

Figure 9:
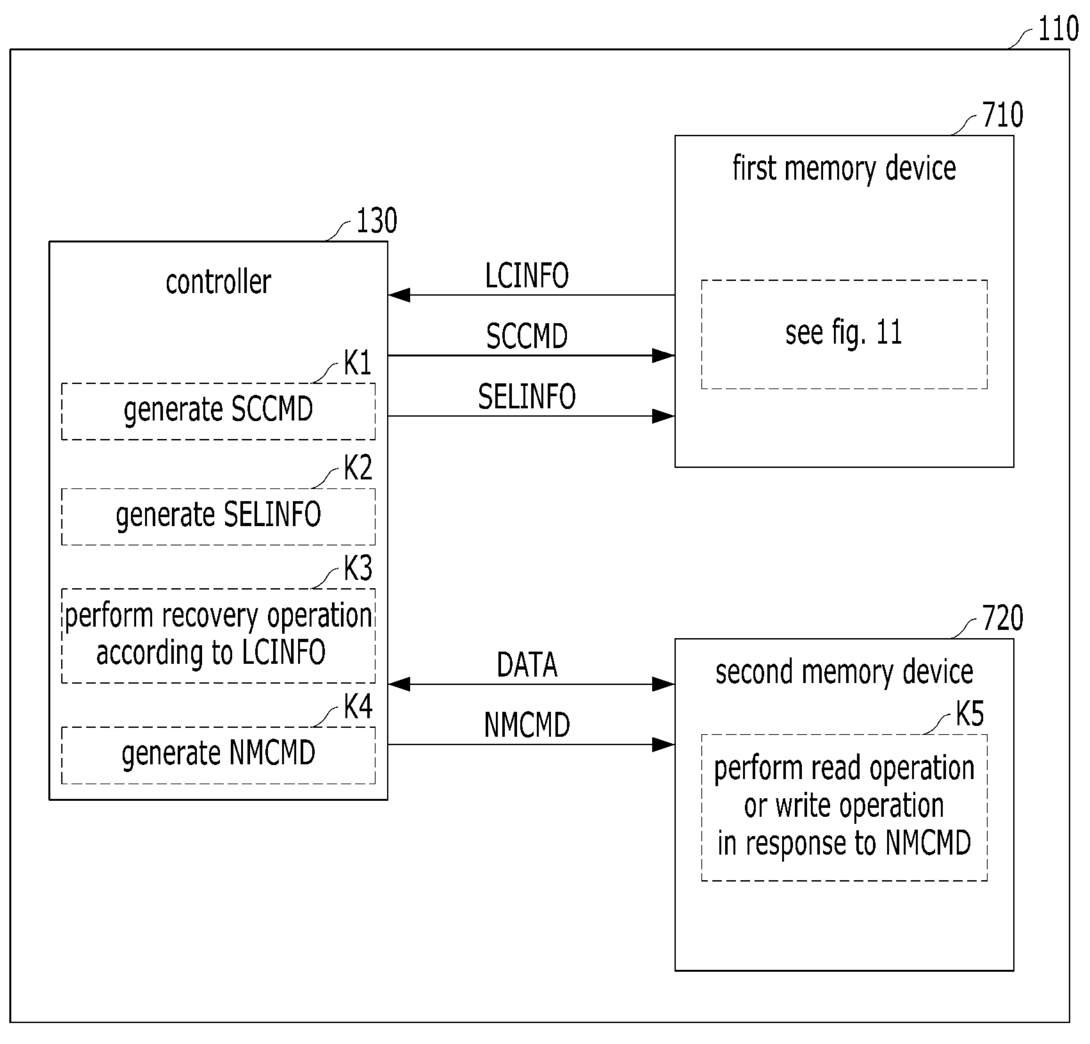
FIG. 9 is a diagram for describing an example of a memory system including a first memory device which self-searches for a boundary word line, in accordance with a second embodiment of the present disclosure.

FIG. 9 is a diagram for describing an example of a memory system including a first memory device which self-searches for a boundary word line, in accordance with a second embodiment of the present disclosure.

Figure 10:
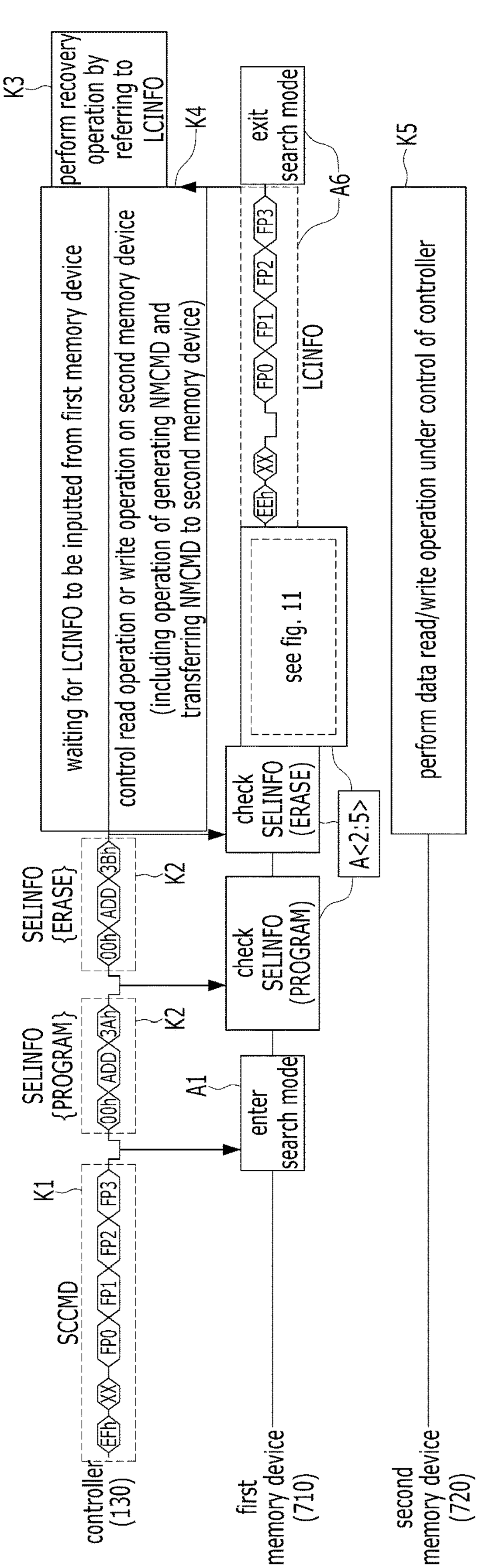
FIG. 10 is a diagram for describing associated operations of a controller and first and second memory devices included in the memory system in accordance with the second embodiment of the present disclosure illustrated in FIG. 9.

FIG. 10 is a diagram for describing associated operations of a controller and first and second memory devices included in the memory system in accordance with the second embodiment of the present disclosure illustrated in FIG. 9.

Figure 11:
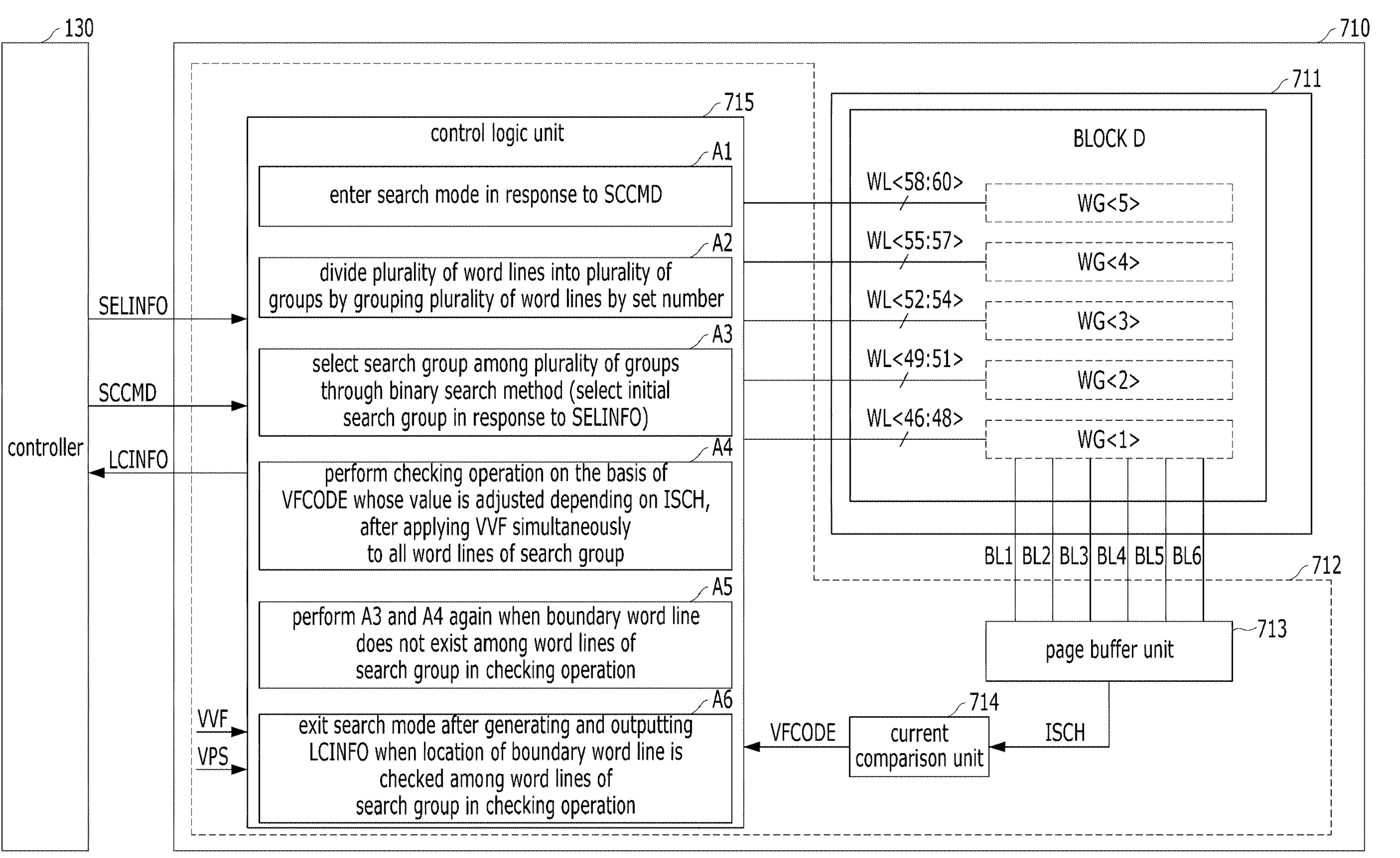
FIG. 11 is a diagram for describing a detailed configuration of the first memory device among components of the memory system in accordance with the second embodiment of the present disclosure illustrated in FIG. 9.

FIG. 11 is a diagram for describing a detailed configuration of the first memory device among components of the memory system in accordance with the second embodiment of the present disclosure illustrated in FIG. 9.

Referring to FIG. 9, a memory system 110 may include a controller 130, a first memory device 710 and a second memory device 720.

When power is resumed after a sudden power-off (SPO), the controller 130 may perform a recovery operation on at least one memory device of the first memory device 710 and the second memory device 720.

In the illustrated embodiment, two memory devices 710 and 720 are included in the memory system 110. It is possible that more than two memory devices are included in the memory system 110 according to a designer's choice. In the illustrated embodiment, a recovery operation is performed on the first memory device 710 of the two memory devices 710 and 720 included in the memory system 110 and a recovery operation is not performed on the second memory device 720. It is possible that a recovery operation is simultaneously performed on the two memory devices 710 and 720 according to the designer's choice.

In more detail, referring to FIGS. 9 and 10 together, when power is resumed after an SPO, the controller 130 may generate a search command SCCMD and output the search command SCCMD to the first memory device 710 selected as a recovery target (K1). The first memory device 710 may enter a search mode in response to the search command SCCMD (A1).

After K1, the controller 130 may generate select information SELINFO and output the select information SELINFO to the first memory device 710 (K2). According to an embodiment, after outputting the search command SCCMD to the first memory device 710, the controller 130 may output an address indicating a word line which is last checked as being in a program state before the SPO among a plurality of word lines, as a part SELINFO {PROGRAMMED} of the select information SELINFO, and then, may output an address indicating each word line which is last checked as being in an erase state before the SPO among the plurality of word lines, as the other part SELINFO {ERASED} of the select information SELINFO, to the first memory device 710. The first memory device 710 may check the word line which is determined to be in a program state before the SPO, in response to the part SELINFO {PROGRAMMED} of the select information SELINFO and may check the word line which is determined to be in an erase state before the SPO, in response to the other part SELINFO {ERASED} of the select information SELINFO.

The first memory device 710 may perform an operation of searching for a boundary word line existing between the word line checked as being in a program state and the word line checked as being in an erase state and may generate location information LCINFO as a result of the search operation and output the location information LCINFO to the controller 130 (A<2:6>).

For the detailed operations A<2:6> of the first memory device 710, reference may be made to FIG. 11. Referring to FIG. 11, it may be seen that the operations are exactly the same as the operations of the memory device 150 which self-searches for a boundary word line in accordance with the first embodiment of the present disclosure described above with reference to FIG. 1. I the same manner as the memory device 150 in FIG. 1 includes the memory cell array 10 and the control circuit 20, the first memory device 710 in FIG. 11 may include a memory cell array 711 and a control circuit 712. Also, in the same manner as the control circuit 20 in FIG. 1 includes the page buffer unit 21, the current comparison unit 22 and the control logic unit 23, the control circuit 712 in FIG. 11 may include a page buffer unit 713, a current comparison unit 714 and a control logic unit 715. Moreover, in the same manner as the control logic unit 23 in FIG. 1 performs the operations C1 to C6, the control logic unit 715 in FIG. 11 may perform operations A1 to A6.

Therefore, for the detailed configuration and operation of the first memory device 710 illustrated in FIG. 11, reference may be made to the detailed configuration and operation of the memory device 150 described above with reference to FIG. 1, and detailed description thereof will be omitted herein.

In response to that the location information LCINFO is inputted from the first memory device 710, the controller 130 may perform a recovery operation on the first memory device 710 (K3).

During a period in which the location information LCINFO is inputted from the first memory device 710 after the controller 130 outputs the search command SCCMD and the select information SELINFO to the first memory device 710, the controller 130 may generate a normal command NMCMD for controlling a read operation or a write operation and output the normal command NMCMD to the second memory device 720 (K4). The second memory device 720 may perform the read operation or the write operation in response to the normal command NMCMD (K5). For example, the second memory device 720 may perform the read operation of outputting data DATA stored therein to the controller 130, in response to a read command of the normal command NMCMD. For another example, the second memory device 720 may store therein data DATA inputted from the controller 130, in response to a write command of the normal commands NMCMD.

In summary, when performing a recovery operation on the first memory device 710, during a period in which the first memory device 710 performs an operation of self-searching for a boundary word line, that is, during a period in which the location information LCINFO is inputted from the first memory device 710 after the controller 130 outputs the search command SCCMD and the select information SELINFO to the first memory device 710, the controller 130 may control the operation of the second memory device 720. The operation of the second memory device 720 may not be limited to an operation corresponding to the normal command NMCMD. For example, the second memory device 720 may also perform a background operation or a recovery operation.

The aforementioned present disclosure is not limited to the aforementioned embodiments and the accompanying drawings, and it will be apparent by those skilled in the art to which the present disclosure pertains that various substitutions, modifications, and changes can be made without departing from the technical spirit of the present disclosure and the following claims. Furthermore, the embodiments may be combined to form additional embodiments.

What is claimed is:

1. A memory device comprising:

a memory cell array including a plurality of memory cells which are coupled between a plurality of word lines and a plurality of bit lines; and a control circuit configured to:

select a search group through a group-based binary search method for a plurality of groups obtained by grouping the plurality of word lines by a set number in an entry period of a search mode, perform a checking operation of simultaneously checking whether a boundary word line exists among word lines of the search group and at which location among the word lines of the search group the boundary word line is located, on the basis of a comparison between a magnitude of a search current obtained by summing currents respectively flowing through the plurality of bit lines and a magnitude of a reference current, by referring to a location table which stores locations of the boundary word line corresponding to values of a result of the comparison, in a state in which a detection voltage is applied to all word lines of the search group each time the search group is selected, generate location information indicating at which location among the word lines of the search group the boundary word line is located by checking a value of the result of the comparison in the location table, and exit the search mode after outputting the location information to the outside.

2. The memory device according to claim 1, wherein, during a period in which the detection voltage is applied simultaneously to all word lines of the search group, the control circuit applies a pass voltage simultaneously to all word lines of remaining groups except the search group.

3. The memory device according to claim 2, wherein the control circuit comprises:

a page buffer unit configured to output the search current by summing currents flowing through the plurality of bit lines, respectively;

a current comparison unit coupled to the page buffer unit, and configured to compare the magnitude of the search current with the magnitude of the reference current in the entry period of the search mode and generate a detection code by varying a value thereof according to a comparison result; and a control logic unit configured to:

select the search group as one of the plurality of groups in the entry period of the search mode, perform the checking operation on the basis of a value of the detection code generated in the current comparison unit by referring to the location table after applying the detection voltage simultaneously to all word lines of the search group and applying the pass voltage simultaneously to all word lines of the remaining groups each time the search group is selected, generate the location information by checking the value of the detection code in the location table, and exit the search mode after outputting the location information to the outside.

4. The memory device according to claim 3, wherein the control logic unit comprises:

a group selector configured to select the initial search group in response to the select information inputted from the outside, in a state in which a search entry signal is activated, reselect a search group in response to a reselect signal, and generate a group select signal for dividing the plurality of groups into the search group and the remaining groups each time the search group is selected;

a plurality of voltage selectors corresponding to the plurality of groups, respectively, each voltage selector configured to select one voltage of the detection voltage and the pass voltage in response to the group select signal, in a state in which the search entry signal is activated and apply the selected voltage simultaneously to all word lines of a corresponding group;

an operation performer configured to perform the checking operation on the basis of a value of the detection code generated in the current comparison unit, in a state in which the search entry signal is activated, and generate a completion signal and the location information or the reselect signal according to a result of the checking operation; and a mode operator configured to activate the search entry signal in response to the search command inputted from the outside and deactivate the search entry signal in response to the completion signal after outputting the location information to the outside.

5. The memory device according to claim 4, wherein the control logic unit further comprises the location table, and wherein the operation performer generates the reselect signal when it is checked, by referring to the location table, that a value of the detection code is one of a set minimum value and a set maximum value.

6. The memory device according to claim 5, wherein, when it is checked, by referring to the location table, that a value of the detection code is at which location between the set minimum value and the set maximum value, the operation performer generates the completion signal together with the location information indicating that the boundary word line is located at which location among the word lines of the search group, as a result of the checking operation.

7. The memory device according to claim 3, wherein the current comparison unit comprises:

a reference current generator configured to generate the reference current;

a comparison current generator configured to generate a comparison current depending on a difference between the magnitude of the search current and the magnitude of the reference current; and an analog-to-digital converter configured to convert the comparison current into the detection code.

8. The memory device according to claim 1, wherein the control circuit enters the search mode in response to a search command inputted from the outside, and selects an initial search group in response to select information inputted from the outside after the search command, and when it is checked, on the basis of the value of the result of the comparison in the checking operation, that the boundary word line does not exist among the word lines of the search group, the control circuit performs the checking operation again by reselecting a search group.

9. The memory device according to claim 8, wherein, when existence and a location of the boundary word line among the word lines of the search group are simultaneously checked on the basis of the value of the result of the comparison in the checking operation, the control circuit generates the location information corresponding to the checked location and exits the search mode after outputting the location information to the outside.

10. The memory device according to claim 1, wherein the boundary word line is, among the plurality of word lines, a word line in an erase state which is adjacent to a word line in a program state or a word line in a program state which is adjacent to a word line in an erase state.

11. A memory system comprising:

a controller configured to generate and output a search command when power is resumed after a sudden power-off (SPO), and perform a recovery operation in response to location information; and a first memory device including a plurality of memory cells which are coupled between a plurality of word lines and a plurality of bit lines, and a control circuit configured to:

select a search group through a group-based binary search method for a plurality of groups obtained by grouping the plurality of word lines by a set number, in a state in which a search mode is entered in response to the search command, perform a checking operation of checking whether a boundary word line exists among word lines of the search group and at which location among the word lines of the search group the boundary word line is located, on the basis of a comparison between a magnitude of a search current obtained by summing currents respectively flowing through the plurality of bit lines and a magnitude of a reference current, by referring to a location table which stores locations of the boundary word line corresponding to values of a result of the comparison, in a state in which a detection voltage is applied to all word lines of the search group each time the search group is selected, generate location information indicating at which location among the word lines of the search group the boundary word line is located by checking a value of the result of the comparison in the location table, and output the location information to the controller.

12. The memory system according to claim 11, wherein, during a period in which the detection voltage is applied simultaneously to all word lines of the search group, the control circuit applies a pass voltage simultaneously to all word lines of remaining groups except the search group.

13. The memory system according to claim 12, wherein the control circuit comprises:

a page buffer unit configured to output the search current by summing currents flowing through the plurality of bit lines, respectively;

a current comparison unit coupled to the page buffer unit, and configured to compare the magnitude of the search current with the magnitude of the reference current in an entry period of the search mode and generate a detection code by varying a value thereof according to a comparison result; and a control logic unit configured to:

select the search group as one of the plurality of groups in the entry period of the search mode, perform the checking operation on the basis of a value of the detection code generated in the current comparison unit by referring to the location table after applying the detection voltage simultaneously to all word lines of the search group and applying the pass voltage simultaneously to all word lines of the remaining groups each time the search group is selected, generate the location information by checking the value of the detection code in the location table, and exit the search mode after outputting the location information to the controller.

14. The memory system according to claim 13, wherein, after outputting the search command to the first memory device, the controller outputs, to the first memory device as the select information, an address indicating each of word lines which are last checked as being in a program state and in an erase state before the SPO among the plurality of word lines.

15. The memory system according to claim 11, wherein the control circuit enters the search mode in response to the search command, and selects an initial search group in response to select information inputted from the controller after the search command, and when it is checked, on the basis of the value of the result of the comparison in the checking operation, that the boundary word line does not exist among the word lines of the search group, the control circuit performs the checking operation again by reselecting a search group.

16. The memory system according to claim 15, wherein, when existence and a location of the boundary word line among the word lines of the search group are simultaneously checked on the basis of the value of the result of the comparison in the checking operation, the control circuit generates the location information and exits the search mode after outputting the location information to the controller.

17. The memory system according to claim 11, wherein the boundary word line is, among the plurality of word lines, a word line in an erase state which is adjacent to a word line in a program state or a word line in a program state which is adjacent to a word line in an erase state.

18. The memory system according to claim 11, further comprising:

a second memory device configured to write or read data to or from a storage area therein under control of the controller, in a state in which the first memory device enters the search mode.

19. A method for operating a memory device including a plurality of memory cells coupled between a plurality of word lines and a plurality of bit lines, the method comprising:

entering a search mode in response to a search command;

selecting a search group through a group-based binary search method for a plurality of groups obtained by grouping the plurality of word lines by a set number in an entry period of the search mode;

performing a checking operation of checking whether a boundary word line exists among word lines of the search group selected in the selecting and at which location among the word lines of the search group the boundary word line is located, on the basis of a comparison between a magnitude of a search current obtained by summing currents respectively flowing through the plurality of bit lines and a magnitude of a reference current, by referring to a location table which stores locations of the boundary word line corresponding to values of a result of the comparison, in a state in which a detection voltage is applied to all word lines of the search group; and repeating the selecting and the checking when the boundary word line does not exist among the word lines of the search group in the checking operation, generating location information indicating at which location among the word lines of the search group the boundary word line is located by checking a value of the result of the comparison in the location table, and exiting the search mode after outputting the location information to the outside.

20. The method according to claim 19, wherein the checking includes applying, during a period in which the detection voltage is applied simultaneously to all word lines of the search group, a pass voltage simultaneously to all word lines of remaining groups except the search group.

21. The method according to claim 19, wherein the selecting comprises:

selecting an initial search group in response to select information inputted from the outside after the search command; and reselecting a search group according to the binary search method each time the operation control act is repeated.

22. The method according to claim 19, wherein the boundary word line is, among the plurality of word lines, a word line in an erase state which is adjacent to a word line in a program state or a word line in a program state which is adjacent to a word line in an erase state.

* * * * *